United States Patent [19]

Spence

[11] 3,925,690

[45] Dec. 9, 1975

[54] DIRECT DRIVE CIRCUIT FOR LIGHT EMITTING DIODES

[75] Inventor: John R. Spence, Villa Park, Calif.

[73] Assignee: Rockwell International Corporation, El Segundo, Calif.

[22] Filed: Sept. 30, 1974

[21] Appl. No.: 510,254

[52] U.S. Cl. ............ 307/270; 307/311; 340/324 M; 340/336; 307/297

[51] Int. Cl.$^2$ ........................ H03K 1/02; H05B 39/04; H05B 39/02; H03K 3/42

[58] Field of Search ...... 307/270, 297, 311; 323/21; 340/173 LS, 166 EL, 324 M, 336; 58/50 R

[56] References Cited

UNITED STATES PATENTS

| | | | |
|---|---|---|---|
| 3,388,292 | 6/1968 | Burns | 307/311 X |
| 3,693,060 | 9/1972 | Joyce | 307/252 T X |
| 3,705,316 | 12/1972 | Burrows et al. | 307/311 |
| 3,745,072 | 7/1973 | Scott, Jr. | 357/4 X |
| 3,770,967 | 11/1973 | Hanna et al. | 307/311 X |
| 3,784,844 | 1/1974 | McGrogan, Jr. | 307/311 X |
| 3,813,664 | 5/1974 | Geyer | 307/311 X |

OTHER PUBLICATIONS

Schlig, "MOS Current Driver for Light-Emitting Diodes"; IBM Tech. Discl. Bull.; Vol. 15, No. 2, pp. 498–499; 7/1972.

Owen et al., "Solid-State Control Circuit for Bilateral LED"; IBM Tech. Discl. Bull.; Vol. 13, No. 3, pp. 651; 8/1970.

Ando et al., "New Solid-State Image Scanner Capable of Random-Positioning"; NEC Research & Development, No. 27 (10/1972); pp. 22-26.

*Primary Examiner*—John S. Heyman
*Assistant Examiner*—L. N. Anagnos
*Attorney, Agent, or Firm*—H. Fredrick Hamann; G. Donald Weber, Jr.; Morland C. Fischer

[57] ABSTRACT

A self-regulating circuit is disclosed for driving a load, such as an arithmetical calculator display using light-emitting diodes, directly from a single MOS calculator chip. A strobe driver, which may be a field effect transistor has its gate electrode connected to a regulated supply of dc voltage, its drain electrode connected to a supply of voltage subject to variation, and its source electrode connected at a common point to one terminal of each of the light-emitting diodes of the display in order that the light-emitting diodes may be driven thereby. A second field effect transistor is also provided and has the conduction path thereof connected between the other terminal of a respective light-emitting diode and a reference potential, e.g. ground, to selectively complete a current path including the respective light-emitting diode. Hence, a light-emitting diode may be illuminated at a particular time and according to a predetermined order as controlled by the application of signals at the gate electrode of the second field effect transistor.

14 Claims, 2 Drawing Figures

DIRECT DRIVE CIRCUIT FOR LIGHT EMITTING DIODES

BACKGROUND OF THE INVENTION

1. Field of the Invention

This invention relates generally to small calculators of the type which may be held by hand, and more particularly, to a circuit for driving a calculator display composed of light-emitting diode segments directly from a single MOS calculator chip.

2. Description of the Prior Art

A conventional method for driving a light-emitting diode calculator display has been to employ a plurality of external bipolar buffer transistors and current-limiting resistors so as to handle the high peak currents required in the light-emitting diode. For each digit of the display to be illuminated, nine such bipolar buffer transistors and resistors were usually required in addition to a respective nine switches to operate each of the bipolar transistors for the purpose of activating a particular light-emitting diode display segment. As a consequence, the conventional method for driving the light-emitting diodes has resulted in problems of space consumation as well as a corresponding increased cost per display. In addition, relatively high voltages were required to maintain a bright display, because the display has been known to otherwise become dimmed as an associated voltage supply becomes subsequently diminished with the continued passage of time.

SUMMARY OF THE INVENTION

Briefly, and in general terms, a self-regulating circuit for driving a load is disclosed. In the preferred form of the invention, the load consists of a segmented calculator readout display formed of a plurality of light-emitting diodes. Each of the light-emitting diode segments has a first and second terminal. A strobe driver is provided to drive the light-emitting diode segments, the strobe driver consisting of a first field effect transistor having a source, a gate, and a drain electrode. The gate electrode of the strobe driver is connected to a regulated voltage source which maintains the voltage level at the gate substantially constant. The source electrode is connected at a common point to the first terminal of each of the light-emitting diode segments. The drain electrode is connected to a source of dc voltage subject to variation. A second field effect transistor is also provided and has the source-drain conduction path connected between the second terminal of a respective light-emitting diode segment and a reference potential source to selectively complete a current path in response to a signal at the gate electrode of the second field effect transistor. Thus, a particular segment to be displayed may be activated in a predetermined order. As the voltage supply subject to variation at the drain electrode of the strobe driver field effect transistor changes, the impedance of the strobe driver will also change a proportionate amount so as to maintain the current through the strobe driver to the light-emitting diode load substantially constant. The instant circuit arrangement is also designed so as to enable the light-emitting diode display to be driven directly from a single MOS calculator chip.

DESCRIPTION OF THE PREFERRED EMBODIMENT

Figure 1:
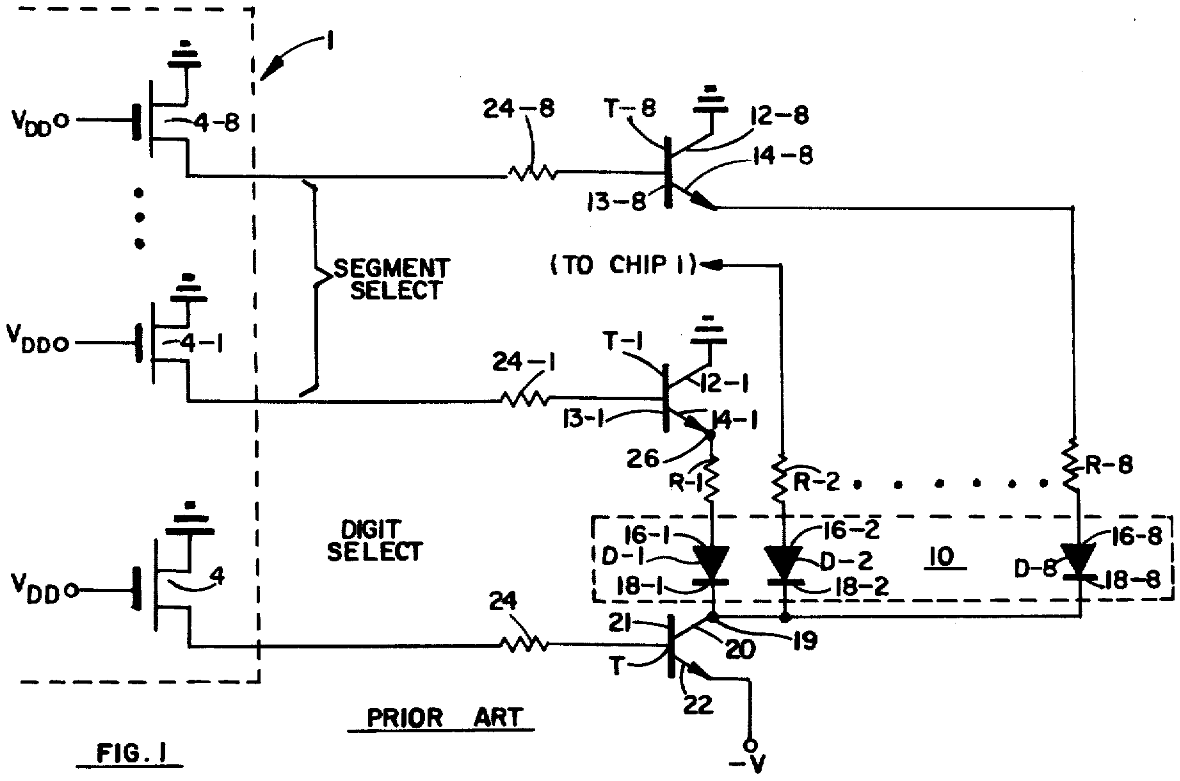
FIG. 1 shows a prior art circuit for driving a light-emitting diode display.

Relating to FIG. 1, a conventional circuit known in the prior art for driving the display 10 of a light-emitting diode readout, such as that found in a hand-held arithmetical calculator, is shown. Briefly, a conventional metal oxide semiconductor (MOS) chip 1 and an associated display circuit 10 are illustrated. The chip 1 contains a strobe driver or digit select field effect transistor (FET) 4 and a plurality of segment select field effect transistors (FETS) 4–1 . . . 4–8. One strobe FET 4 is required to drive each digit of the display, and since each digit to be displayed is generally formed from seven discrete segments plus a decimal point, eight segments select FETs 4–1 . . . 4–8 are required. For convenience, only one digit is illustrated in display 10.

The display 10 is comprised of a plurality of light-emitting diode segments D–1 . . . D–8, one light-emitting diode being connected to a respective segment select FET 4–1 . . . 4–8 through an associated NPN bipolar buffer transistor T–1 . . . T–8. Buffer transistors T–1 . . . T–8 have been employed to handle the relatively high peak currents drawn by the light-emitting diode segments. Each of the transistors T–1 . . . T–8 has the collector electrode 12 thereof connected directly to a suitable reference potential source, for example ground. Also, each of these transistors has the emitter electrode 14 thereof connected to the anode 16 of a respective light-emitting diode D–1 . . . D–8 through a resistor R–1 . . . R–8. Current balancing resistors R–1 . . . R–8 have been employed to evenly distribute the current passing through the light-emitting diode segments in the event that not all segments are being illuminated. Digit select FET 4 is connected to bipolar transistor T, and the collector electrode 20 of transistor T is connected in common at junction 19 with the cathodes 18 of light-emitting diodes D–1 . . . D–8. The emitter electrode 22 of transistor T is connected directly to a supply of negative voltage –V which typically may be between –6 and –9 volts. The digit select FET 4 and each of the segment select FETs 4–1 . . . 4–8 have respective source, gate and drain electrodes as shown. The drain electrodes of FETs 4–1 . . . 4–8 are connected directly to ground, the gate electrodes are connected to a supply of voltage $V_{DD}$, and the source electrodes are connected to the bases 13 of transistors T–1 . . . T–8 through series-connected current limiting resistors 24–1 . . . 24–8. The drain electrode of digit select FET 4 is connected directly to ground, the gate electrode is connected to the supply of voltage $V_{DD}$ and the source electrode is connected to the base 21 of transistor T through series-connected current limiting resistor 24. By way of example, it may thus be seen that with the conventional driving techniques, nine external transistors and nine associated current limiting resistors have been required per digit of display.

In operation, segment select FETs 4–1 . . . 4–8 are turned on at particular times in a predetermined order such as that controlled by conventional programming techniques. When a particular segment FET, for example FET 4–1, is turned on, current will flow from the source electrode into the base electrode 13 of the associated transistor, e.g. transistor T–1 and through the collector electrode 12. This action will cause node 26 to be at ground potential. Similarly, when digit select FET 4 is turned on, current will flow from the source electrode to the base 21 of transistor T and through the emitter electrode 22 to the supply of negative voltage −V. This will result in node 19 having the negative potential −V impressed thereon, so as to thereby forward bias light-emitting diode D–1 and produce current through resistor R–1 and through light-emitting diode D–1 to common junction 19. Thus, the particular segment of the display represented by light-emitting diode D–1 is illuminated. A similar operation can occur with FETs 4–2 . . . 4–8, external transistors T–2 . . . T–8, and respective light-emitting diodes D–2 . . . D–8.

However, one shortcoming of the conventional drive circuit of FIG. 1 is that as the negative supply of voltage −V diminishes, nothing is provided therein to cause the circuit to drive any harder or to cause the current which passes through the light-emitting diodes to remain at a sufficient level to maintain a proper illumination throughout the display. Hence, without the addition of further regulating components, the display will tend to become undesirably dimmed.

Figure 2:
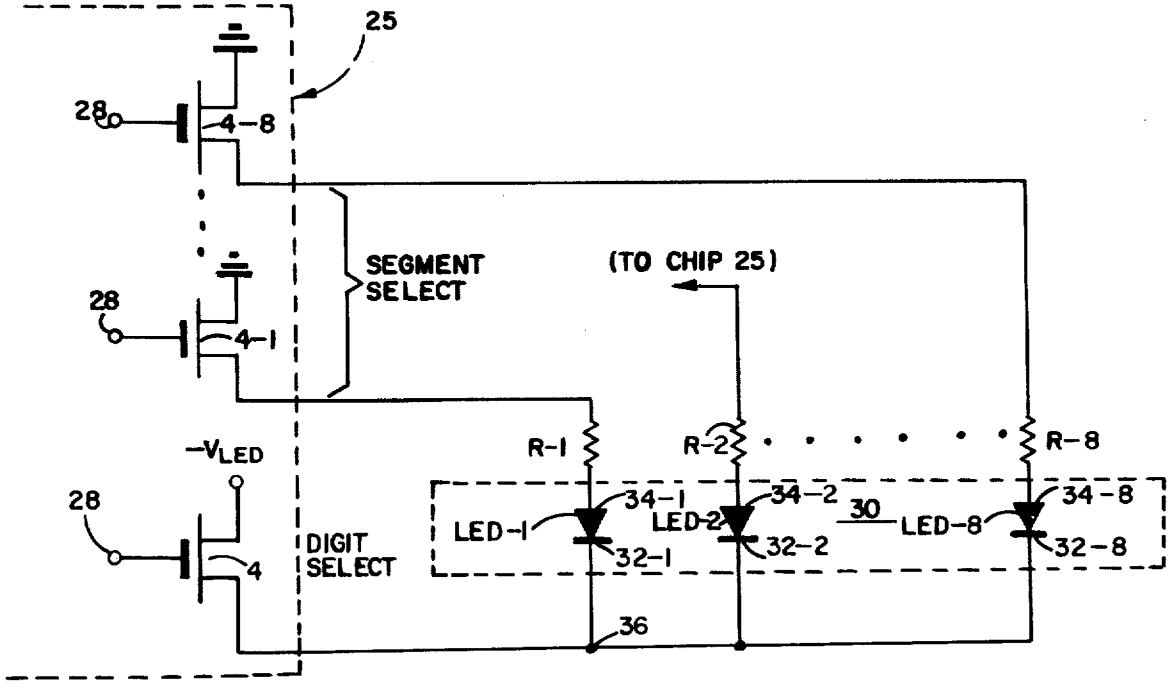
FIG. 2 shows the self-regulating circuit of the instant invention for driving a light-emitting diode display directly from a MOS calculator chip.

In accordance with the instant invention, and now referencing to FIG. 2 of the drawings, a unique, self-regulating circuit is described for driving a light-emitting diode display 30 directly from a single MOS calculator chip 25 so as to eliminate the use of the external buffer transistors (T . . . T–8) and the associated current limiting resistors (24 . . . 24–8) as has heretofore been required in the prior art. MOS chip 25 contains a strobe driver or digit select FET 4 for each digit to be displayed and one or more (e.g. eight) segment select FETs 4–1 . . . 4–8 (where it is desirable that a digit of display 30 should be formed from seven segments plus a decimal point). As in FIG. 1, for purposes of convenience in illustration, the FETs shown comprise a one digit display only, but the invention is not to be regarded as limited thereto. FETs 4 . . . 4–8, in the instant embodiment of FIG. 2 may be conventional p-channel FETs. FETs 4 . . . 4–8 may each be comprised of a layer of silicon on a sapphire substrate and formed by conventional techniques. However, the invention is not so limited, and these or other suitable types of devices are contemplated.

By forming a display unit 30 of 0.5 ma. dc light-emitting diode devices LED–1 . . . LED–8, it is possible to drive the diodes LED–1 . . . LED–8 directly from the chip 25, in accordance with the instant invention and as to be explained more fully hereinafter. Although only one light-emitting diode is illustrated to comprise each segment of display to be illuminated, the invention is not to be limited thereto. It is within the scope of the invention to comprise each segment of any suitable number of light-emitting diodes. Each light-emitting diode LED–1 . . . LED–8 has a respective current balancing resistor R–1 . . . R–8 connected in series therewith to regulate the drive current being conducted thereto.

A strobe driver is provided including output driver FET 4 which is utilized to generate cyclical strobe output signals to drive the desired display segments having light-emitting diodes LED–1 . . . LED–8. In the present embodiment, the gate electrode of strobe FET 4 is connected to a regulated source of voltage 28, which typically may be a −15 v. dc supply, so as to maintain the voltage level at the gate electrode substantially constant. For a more detailed description of a suitable strobe driver, such as that just mentioned, reference may be made to my U.S. Pat. No. 3,798,616, issued Mar. 19, 1974, and assigned to the present assignee. While it has been known in prior art driving techniques, such as that shown in FIG. 1, to connect the drain electrode of a strobe FET directly to ground, in the instant invention, the drain electrode of FET 4 is connected to a source of dc voltage $-V_{LED}$ which is subject to variation and may typically be a nine volt battery supply, the advantage of which will become readily apparent. The source electrode of FET 4 is connected to node 36 which is common to the cathodes 32–1 . . . 32–8 of light-emitting diodes LED–1 . . . LED–8.

Each segment select FET 4–1 . . . 4–8 has the source electrode thereof connected to the anode 34–1 . . . 34–8 of a respective light-emitting diode segment through a current balancing resistor R–1 . . . R–8. The drain electrodes of FETs 4–1 . . . 4–8 are connected to ground, and the gate electrodes are connected to the source of regulated voltage 28, as shown.

During operation, digit select or strobe FET 4 can be made to turn on harder than in conventional display circuits. Even if the supply voltage $-V_{LED}$ at the drain electrode tends to drop to a lower voltage in time, such as, for example as the battery thereof is used up, the gate electrode of FET 4 will continue to be supplied with substantially constant voltage from the regulated source of voltage 28. The instant driving arrangement can thus keep the display brighter at lower relative voltages than that required by prior art driving techniques. This feature can be better understood by realizing that due to the large current which passes through strobe driver FET 4 (approximately 36 ma. in a 1/9 duty cycle multiplex system with 8 segments per digit to be displayed and where each light-emitting diode is rated at 0.5 ma. dc), the effective drive of FET 4 becomes dependent upon the $-V_{LED}$ voltage supply and the impedance of FET 4 when in the conducting mode. By regulating the chip voltage of source 28 at a constant level of −15 volts, it has been found that as the $-V_{LED}$ voltage supply diminishes, for example, from −9 volts to a lower voltage during use, the impedance of FET 4 in the conducting mode will also decrease proportionately therewith to thereby establish a self-regulating light-emitting diode drive circuit, unlike prior art drive circuits, and maintain a required current flow through strobe driver 4 and to the light-emitting diode display.

Suitable well known programming means may be provided off the chip to activate a particular number of segment select FETs 4–1 . . . 4–8 in a predetermined order so as to connect the source electrode of a FET 4–1 . . . 4–8 to the anode of a respective light-emitting diode LED–1 . . . LED–8 through a series-connected resistor R–1 . . . R–8. When FETs 4 . . . 4–8 are in the conducting mode, the respective anodes 34–1 . . . 34–8 of light-emitting diodes LED–1 . . . LED–8 will be grounded while the respective cathodes 32–1 . . . 32–8 will be connected to the source of voltage $-V_{LED}$ through the common node 36 so as to effectively forward bias diodes LED–1 . . . LED–8 to thereby cause a current to flow from the anode 34–1 . . . 34–8 to the cathode 32–1 . . . 32–8 to consequently illuminate a respective light-emitting diode LED–1 . . . LED–8.

A circuit for driving a display comprised of light-emitting diodes has been disclosed. The instant circuit alleviates the need for a plurality of external buffer transistors and associated series-connected current limiting resistors to thereby reduce the number of components and the overall cost required as compared to prior art driver circuits. At the same time, the space that can be saved by virtue of the instant invention makes the display ideally suited to be driven directly from the single MOS calculator chip. Moreover, a brighter display may be produced at lower relative voltages as compared with the conventional driving techniques to have the effect of increasing the life and operability of the calculator and its associated chip. For example, as the supply of source voltage ($-V_{LED}$) is reduced due to age, the brightness of the light-emitting diode display is preserved. By virtue of the unique connection of the drain electrode of the strobe driver field effect transistor to a source of voltage subject to variation, a self-regulating light-emitting diode drive circuit is developed.

It will be apparent that while a preferred embodiment of the invention has been shown and described, various modifications and changes may be made without departing from the true spirit and scope of the invention. For example, while FETs 4 . . . 4-8 have been disclosed as p-channel devices, it is to be understood that suitable n-channel transistor devices may be satisfactorily substituted therefor. These n-channel devices would have electrode terminals thereof adapted to be connected to respective potential supplies of appropriate magnitude and polarity.

Having thus set forth the preferred embodiment of the invention, what is claimed is:

1. A self regulating circuit for driving a load having first and second load terminals thereof, said circuit comprising
   - a first field effect transistor having source, gate, and drain electrodes and a variable impedance thereof,
   - said source electrode connected to the first of said load terminals,
   - said gate electrode connected to a first source of regulated voltage so as to maintain the voltage at said gate electrode substantially constant,
   - said drain electrode connected to a second source of voltage subject to variation, the impedance of said first field effect transistor adapted to vary a proportionate amount with a variation of said second source of voltage so as to maintain the supply of drive current to said load substantially constant,
   - a second field effect transistor having source, gate, and drain electrodes,
   - said gate electrode of said second field effect transistor connected to said first source of regulated voltage, and
   - the source-drain conduction path of said second field effect transistor comprising a current regulating path selectively connected between the second of said load terminals and a reference potential supply to continuously control the supply of drive current to said load.

2. The invention of claim 1, wherein said load comprises at least one light-emitting diode.

3. The invention of claim 1, wherein said first and second field effect transistors are disposed upon a single metal oxide semiconductor-type chip.

4. The invention of claim 1, including impedance means additionally comprising said current regulating path, said impedance means connected in series with said source-drain conduction path of said second field effect transistor to continuously control the supply of drive current to said load.

5. The invention of claim 4, wherein said impedance means is a resistor.

6. The invention of claim 1, wherein the magnitude of said first source of regulated voltage is substantially larger than that of said second source of voltage subject to variation.

7. The invention of claim 1, said circuit further comprising a plurality of said second field effect transistors, each of said second field effect transistors having a source-drain conduction path thereof comprising a current regulating path,
   - said load comprising a plurality of light-emitting diodes,
   - the conduction path of each of said plurality of second field effect transistors connected between a respective one of said light-emitting diodes comprising said load and said reference potential supply to continuously control the drive current to each of said respective light-emitting diodes and simultaneously activate any of said light-emitting diodes according to a predetermined sequence of operation.

8. A driver circuit to drive a plurality of light emitting diodes, each having first and second terminals thereof, comprising
   - a first three electrode transistor means including a control electrode and two electrodes having a conduction path formed therebetween,
   - one of said first transistor means conduction path electrodes connected at a common point to the first terminal of each of said plurality of light emitting diodes,
   - a supply of voltage subject to variation applied to the other of said conduction path electrodes of said first transistor means,
   - a constant supply of voltage applied to the control electrode of said first transistor means,
   - a plurality of second three electrode transistor means, each of said second transistor means including a control electrode and two electrodes having a conduction path formed therebetween, each of said conduction paths to be selectively connected to the second terminal of a respective light-emitting diode so as to comprise current regulating paths to continuously control the drive current to said plurality of light-emitting diodes and simultaneously activate any of said light-emitting diodes according to a predetermined sequence of operation, each of said control electrodes connected to selectively receive said constant supply of voltage, and
   - a supply of reference potential applied to one electrode of each of said second transistor means.

9. The invention of claim 8, wherein said first three terminal transistor means is a field effect transistor having source, gate, and drain electrodes thereof.

10. The invention of claim 8, wherein at least one of said plurality of second three terminal transistor means is a field effect transistor having source, gate, and drain electrodes thereof.

11. The invention of claim 8, wherein said first and second three terminal transistor means are p-channel field effect transistors comprised of a layer of silicon on a sapphire substrate.

12. The invention of claim 8, wherein the supply of voltage subject to variation applied to the other of the conduction path electrodes of said first transistor means is a battery.

13. The invention of claim 8, wherein the supply of reference potential applied to the one electrode of each of said plurality of second transistor means is relatively positive with respect to the supply of voltage subject to variation applied to the other of the conduction path electrodes of said first transistor means.

14. The invention of claim 8, wherein each of said current regulating paths includes a respective impedance means connected in series with each of said second transistor means conduction paths to continuously control the drive current to each of said light-emitting diodes.

* * * * *